United States Patent [19]
Johnsrud et al.

[11] Patent Number: 5,144,229
[45] Date of Patent: Sep. 1, 1992

[54] METHOD FOR SELECTIVELY CONDITIONING INTEGRATED CIRCUIT OUTPUTS FOR IN-CIRCUIT TEST

[75] Inventors: Darrell B. Johnsrud; Darvin D. Raph, both of Loveland, Colo.

[73] Assignee: Hewlett-Packard Company, Palo Alto, Calif.

[21] Appl. No.: 752,412

[22] Filed: Aug. 30, 1991

[51] Int. Cl.$^5$ .............................................. G01R 31/28
[52] U.S. Cl. ................................. 324/158 R; 371/22.6
[58] Field of Search .............. 324/158 R, 73.1, 158 T; 371/22.1, 22.6, 28

[56] References Cited

U.S. PATENT DOCUMENTS

| | | | |
|---|---|---|---|
| 3,870,953 | 3/1975 | Boatman et al. | 324/158 T |
| 4,588,945 | 5/1986 | Groves et al. | 324/158 R |
| 4,827,208 | 5/1989 | Oliver et al. | 371/22.6 |
| 4,998,026 | 3/1991 | King | 324/73.1 |

*Primary Examiner*—Ernest F. Karlsen

[57] ABSTRACT

A method for automatically generating an in-circuit board test for a circuit board, comprising a plurality of Interconnected digital devices, selectively provides conditioning only to devices which need conditioning. Devices which need conditioning include outputs which should be conditioned prior to being back-driven and problem devices (such as oscillators) which interfere with the testing of other devices. The device outputs which require conditioning are flagged in a device models library which contains predetermined generic test models for the devices on the board. The method for conditioning back-driven devices comprises selecting a device under test (DUT), receiving electrical interconnect data for the devices on the circuit board, determining from the electrical interconnect data which device outputs are driving the inputs of the DUT, determining from the device models library which back-driven outputs should be conditioned, and conditioning any back-driven outputs which are flagged CONDITION in the device models library. The method for conditioning problem devices includes flagging the problem devices in the device models library, determining whether any problem devices exist on the board, determining from the electrical interconnect data which devices are affected by a problem device, and indicating for each affected devcice which of said problem device outputs are to be conditioned prior to testing said affected device. If the DUT is an affected device, then any problem device outputs which affect it will be conditioned prior to testing the DUT. Generation of the in-circuit test is completed by retrieving from the device models library conditioning methods for each device to be conditioned, combining the conditioning methods together to form a test statement, retrieving a test method for testing the DUT from the device models library, and then merging the test statement for conditioning with the test method for testing the DUT.

8 Claims, 5 Drawing Sheets

METHOD FOR SELECTIVELY CONDITIONING INTEGRATED CIRCUIT OUTPUTS FOR IN-CIRCUIT TEST

FIELD OF THE INVENTION

The present invention relates to the field of digital in-circuit testing. More specifically, the invention relates to a method for automatically generating an in-circuit test wherein digital devices which are to be back-driven are selectively conditioned and wherein digital devices which may interfere with testing of other devices are conditioned so that they will not interfere with testing.

BACKGROUND ART

Traditionally, automated board testing involved functional test wherein input signals were provided to the external inputs of a board and output signals were observed from the external outputs of the board. This type of functional testing, however, can become very complicated for complex circuitry and can provide only limited diagnostics. Modern testing increasingly supplements this traditional functional test with the efficient, flexible in-circuit test. In-circuit test is a type of functional test wherein the performance of each digital integrated circuit (IC) on a board is independently tested as a functional unit.

In order to perform in-circuit test, a tester must apply input signals directly to the inputs of the DUT (device under test or test generation) and must access the outputs of the DUT to observe the output response. A "bed-of-nails" (i.e., probes that directly make contact with the device I/O pins from pads on the surface of the board) fixture is used to provide access to the required nodes on the board. Each digital IC can then be tested as if it were electrically isolated from the circuit. As a result, tests for many common digital IC's can be programmed once, in advance, stored in a library, and then called upon when needed. This greatly simplifies test generation since this pre-programmed test can be used over and over again.

Figure 1:
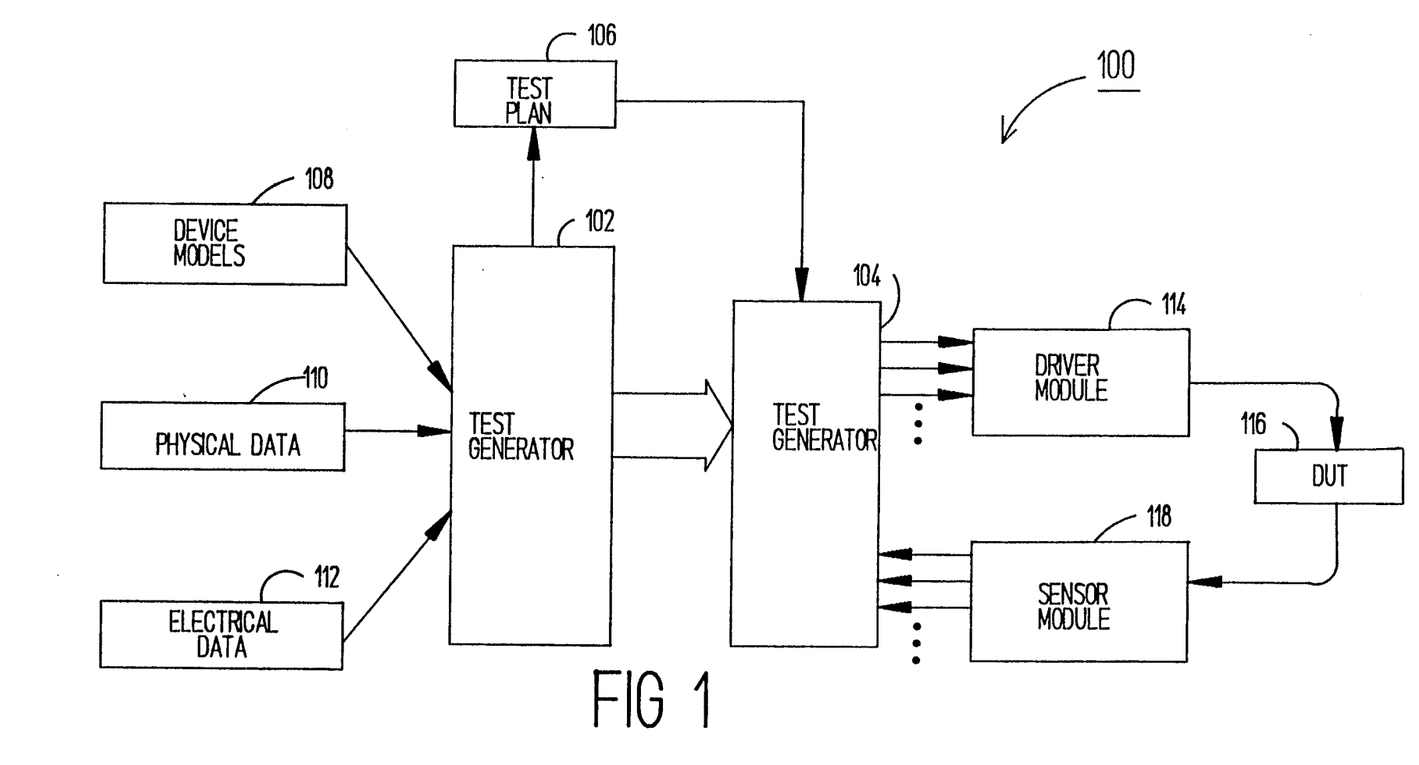
FIG. 1 is a block diagram of a conventional ATE system.

In-circuit testing is conventionally performed on an ATE (Automated Test Equipment) system. An ATE system (tester) 100 is shown in FIG. 1. ATE system 100 includes a test generator 102 and a test controller 104. Test generator 102 generates an in-circuit test for each device on a board to be tested. A generic test plan 106 provides supervisory control over testing. This includes sequencing the tests, logging the result, controlling board/fixture interfacing, controlling the test power supplies, and providing a user interface. The combination of the individual in-circuit tests and test plan 106 forms a board test specification. A device models library 108, physical database 110, and an electrical database 112 provide the data required for test generator 102 to generate the in-circuit tests. Electrical database 112 contains a list of the devices on the board, an electrical description for each device, and electrical interconnect information. Physical database 110 contains a topological description of the board which will be used by test controller 104 to locate and test DUT 116. Physical database 110 and electrical database 112 are typically generated by a CAD/CAM (Computer Aided Design-/Computer Aided Manufacturing) system during design of a board.

Device models library 108 contains a plurality of pre-generated generic models for commonly used digital integrated circuit chips (IC's). Essentially, each model is a test routine which is to be inserted (i.e., edited) into the board test specification. Each device model provides, for a specific device, pin-out information (i.e., which pins are inputs, outputs, bi-directional, or usused), a test program, a method for pre-conditioning (described below) each output of the device, and device specific information including a test pattern rate and required signal levels. When devices which are not in device models library 108 are encountered, a model may be manually entered into the tester and, if desired, the models library.

Test controller 104 executes the in-circuit tests generated by test generator 102. A driver module 114 is used to apply the test signals to a DUT 116, and a sensor (receiver) module 118 is used to receive the response of DUT 116 to the test signals. The combination of driver module 114 and sensor module 118 is known as a tester channel.

The HP3070 tester is an example of an ATE system. The HP3070 is available from Hewlett-Packard Company, Palo Alto, Calif. Detailed operational information for the HP3070 is contained in "HP3070 Board Test System User's Documentation Set (1989)" available from Hewlett-Packard under HP part number 44930A.

While in-circuit test is based on testing each digital IC as if it were isolated from the surrounding devices, in reality, true electrical isolation cannot occur because of existing device interconnections. Consequently the application of an input signal to a DUT is often in conflict with the quiescent state of that input by virtue of its coupling to an upstream output. An "upstream" device is a device whose output is driving an input of the DUT. Upstream output and upstream device are used interchangeably herein.

In order to provide the required input to the DUT, it may be necessary to back-drive or over-drive the output of the upstream device. That is, the upstream output must essentially be overwhelmed so that the tester controls the node between the input of the DUT and the output of the upstream device. This involves forcing a reverse current through the upstream output or sinking a current sourced by the upstream output in order to overcome its quiescent state.

Back-driving digital IC's can cause a plurality of test problems. These include:

1. INSUFFICIENT BACK-DRIVE CURRENT—As discussed above, the ATE system will change the logic state of an upstream output by overwhelming it. Some testers, however, may have insufficient drive capabilities to accomplish this for some devices. For example, if an output at a logical LOW state is to be forced HIGH, then the tester must source sufficient current to force the output transistor of the upstream output out of saturation. The current required to accomplish this can exceed the tester capabilities for certain devices (e.g., Advanced Schottky TTL devices, which are capable of sinking high currents) such that the tester cannot back-drive these devices.

2. COMPONENT DAMAGE - Some digital devices have sensitive outputs which may be damaged by being back-driven. The damage may result from current flow, temperature rise, or voltage over/undershoot. The damage may include immediate failure or simply a degradation in the device's life.

3. COMPONENT OSCILLATION—Attempts to back-drive an output of an integrated circuit which has feedback may result in a sustained oscillation. This will produce unpredictable test results, and may further result in damage to other devices which are connected to the node.

For a more detailed discussion of in-circuit testing and associated back-drive problems, see U.S. Pat. No. 4,588,945 to Groves et al.

Known test methods deal with these problems by pre-conditioning (or simply "conditioning") devices upstream from a DUT. Each output which is to be back-driven is conditioned. Conditioning involves placing the output to be back-driven in a state that can be easily/safely back-driven. The conditioned device/output will then be left in that state throughout the test. For example, the ASTTL device discussed above would have its output placed in a logical HIGH state (for TTL logic it is easier to pull a logical HIGH down to a logial LOW that it is to drive a LOW to a HIGH).

Conventional conditioning is performed either manually or automatically by the ATE. For manual conditioning, a test engineer will identify specific devices which require conditioning and then modify the test to provide conditioning for these specific devices. This method is slow, tedious, and can require a large amount of a test engineer's time. In addition, because the determination of which devices to condition is made at test, the test fixture (which is often fabricated simultaneously with the circuit board) may have to be modified. Modification of the test fixture is costly and can result in test delays.

Many conventional testers provide an automatic upstream condition option. If upstream conditioning is enabled, then all upstream devices will be conditioned. The convention is to key on the DUT, and to condition devices upstream therefrom. Once enabled, conditioning is performed regardless of whether it is required.

Figure 2:
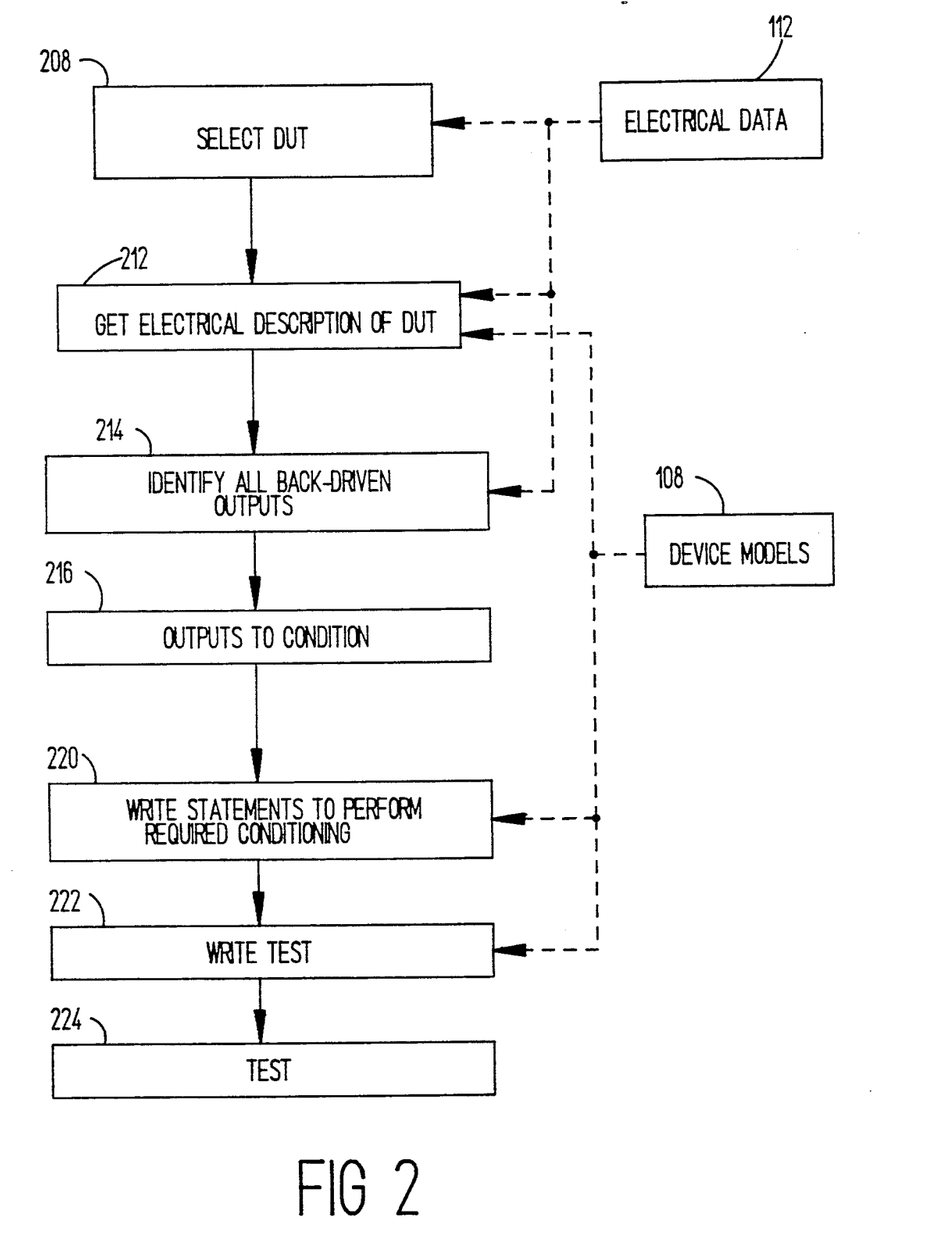
FIG. 2 is flow chart illustrating the conventional method for generating an in-circuit test with conditioning enabled.

The conventional method for generating (at test generator 102) an in-circuit ATE test (with conditioning enabled) for a circuit board is shown in FIG. 2. The data required includes electrical databases 112 and device models library 108.

At step 208, a device (DUT) is selected for test generation from electrical database 112. At step 212, the test generator gets an electrical description of the DUT from electric database 112 and a test method for the DUT from device models library 108. The inputs of the DUT which will be driven during test are determined at this point. Then, at step 214, electrical interconnected data from electrical data 112 is used to identify all device outputs which will be back-driven in order to test the DUT. A list of these outputs to condition is created at step 216.

The test statement required to condition the outputs is written at step 220. Finally, at step 222, the in-circuit ATE test 224 is written for the DUT. Writing the test involves retrieving a generic test for the DUT from device models library 108 and then merging the conditioning test statement from step 220.

Note that since upstream conditioning is enabled, all upstream devices (the number of levels upstream to condition may be selected) are conditioned. The convention is to key on the DUT, and to condition devices upstream therefrom. The conditioning is performed regardless of need for many devices. The result is a large amount of superfluous conditioning. For large circuits, this can severely complicate both the test and the test fixture by requiring access to an inordinate number of circuit nodes.

In addition to complicating testing, performing a large amount of unnecessary conditioning may be impractical or even impossible due to exhaustion of tester channels and/or conditioning conflicts. Conventional ATE systems have a finite, relatively small, number of tester channels (driver/receiver resources), and too often, a test engineer finds that too few tester channels are available to meet his testing needs. Further, conditioning a large number of devices often leads to conflicting (e.g., mutually exclusive) conditioning methods.

Thus, given that carte blanche conditioning is not always possible and that tester channel resources must be used in an efficient manner, a fixed number of upstream levels to condition is normally selected (e.g., condition all back-driven outputs within four levels upstream form the DUT). This arbitrary cut-off for conditioning, however, exacerbates the problem rather than solving it because now even more upstream outputs are being back-driven. For example, if conditioning is selected for N levels upstream, then the devices N+1 levels upstream are being back-driven without conditioning.

Figure 3:
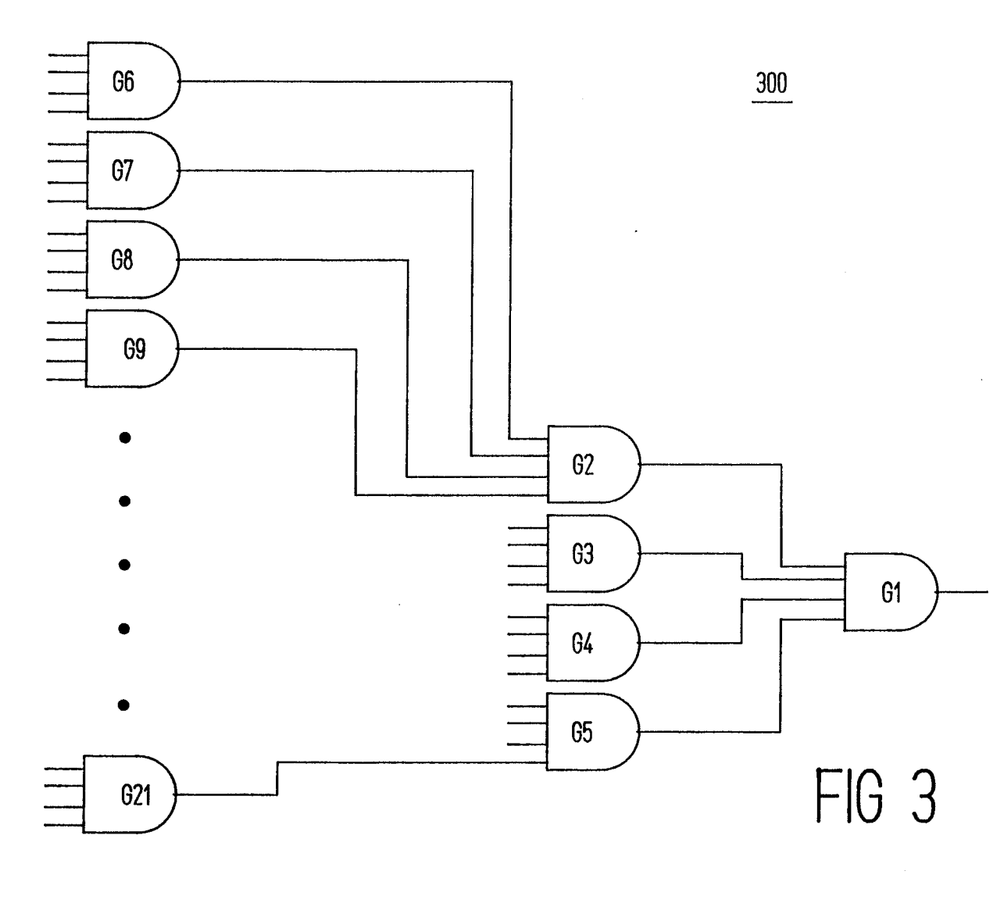
FIG. 3 is a schematic diagram of a sample digital circuit used to illustrate back-driving problems encountered during in-circuit test.

A sample circuit 300 is shown in FIG. 3. Gate G1 is the DUT. In order to test G1, gates G2-G5 will be back-driven. If gates G2 and G8 have sensitive outputs which require conditioning, then a test engineer may either manually make this determination and modify the test to condition G2 and G8, or he may enable conventional upstream conditioning as described above. In order to condition G2 or G8, upstream conditioning must be enabled for two levels upstream from the DUT. This will cause twenty outputs (G2-G21) to be conditioned, requiring access to sixty-four modes. Thus, while conditioning was necessary for only two devices (e.g., G2 and G8), twenty devices are conditioned. As discussed above, an immense test problem is created.

An additional difficulty which plagues conventional in-circuit test is that of "problem" or interfering outputs/devices. These are devices which, if not disabled, will adversely affect or interfere with the test of another device (i.e., the DUT). Test problems causes by problem devices can be difficult to locate because the problem device can affect a remotely located and tenuously associated DUT.

Problem devices include noisy devices, such as oscillators. The "problem" with oscillators is that an output carrying the oscillating signal may not be reliably back-driven. An attempt to back-drive the output may result in a noisy plagued by transients. In addition, the oscillating signal can be propagated through several devices to affect a downstream DUT. Thus, to ensure reliable test results, problem devices must be conditioned. "Conditioning" when applied to problem devices often means disabling the device such that it cannot interfere with testing.

The conventional method for dealing with a problem device is to wait until a problem occurs during test, and to then diagnose the problem and remedy it. This method is, however, manpower intensive, can result in test delays, and can require modification of the test fixture.

What is needed is a method for selectively conditioning only devices which require conditioning, and for making the determination of which devices to condition an automated function of test generation. Also needed is a method for spotting problem devices during test generation and for integrating conditioning for the problem devices into the test for any affected devices.

SUMMARY OF THE INVENTION

The present invention is a method for automatically generating an in-circuit board test for a circuit board comprising a plurality of interconnected digital devices. The test selectively provides conditioning only for devices which require conditioning. Devices which require conditioning include outputs which should be conditioned prior to being back-driven and problem devices such as oscillators which interfere with the testing of other devices.

The device outputs which require conditioning prior to being back-driven and problem devices are flagged in the device models library. The library contains a pre-generated generic test model for each device on the board. A PROBLEM flag is used to indicate a problem or interfering device, and a CONDITION flag is used to indicate an output which should be conditioned prior to being back-driven. The method for conditioning back-driven devices is as follows.

A device under test (DUT) is selected. Electrical interconnect data for the devices on the circuit board is then to determine which device outputs driving the DUT will be back-driven. The CONDITION flag for each back-driven output in the device models library is then used to determine which back-driven outputs should be conditioned.

The method for conditioning interfering devices is as follows. First, the devices on the board are compared to the models in the device models library to determine if any of the devices on the board are problem devices. The electrical interconnect data is then used to determine which devices may be affected by a problem device. A device affected by a problem device is called an affected device. Each problem device is added to a devices-requiring-conditioning list for each affect device.

The conditioning methods for performing the required conditioning for the problem devices listed in the DUT's devices-requiring-conditioning list and the back-driven outputs which are flagged CONDITION are then retrieved from the device models library and used to write a conditioning test statement. The test statement is then merged with the test for the DUT so that the appropriate devices are conditioned when the DUT is tested.

An advantage of the invention is that test generation time is saved by identifying the actual problems and eliminating unnecessary conditioning. Another advantage is that the test fixture may be simplified by reducing the number of nodes which must be accessed. This provides a corresponding reduction in the number of driver/receiver channels which are required for the in-circuit test. This is especially important given that ATE systems have a finite number of driver/receiver channels available.

Yet another advantage is that problem devices are automatically dealt with such that many test problems which have conventionally required operator intervention are eliminated. A further advantage of the invention is that testing is made more reliable by eliminating many potential problems prior to testing.

DESCRIPTION OF THE PREFERRED EMBODIMENT

The present invention is a method for generating an in-circuit test for a circuit board comprising a plurality of interconnected digital devices (i.e., integrated circuits). The invention, as described below and shown in the accompanying figures, provides a method for identifying devices which require conditioning and selectively conditioning only those devices.

The method of the invention for generating an in-circuit test uses ATE system 100 as described above. The data required for test generation includes electrical database 112. Device models library 108 has been replaced with device models library 502 (see FIG. 5). The invention provides conditioning for all devices which require conditioning and does not unnecessarily condition other devices.

Figure 5:
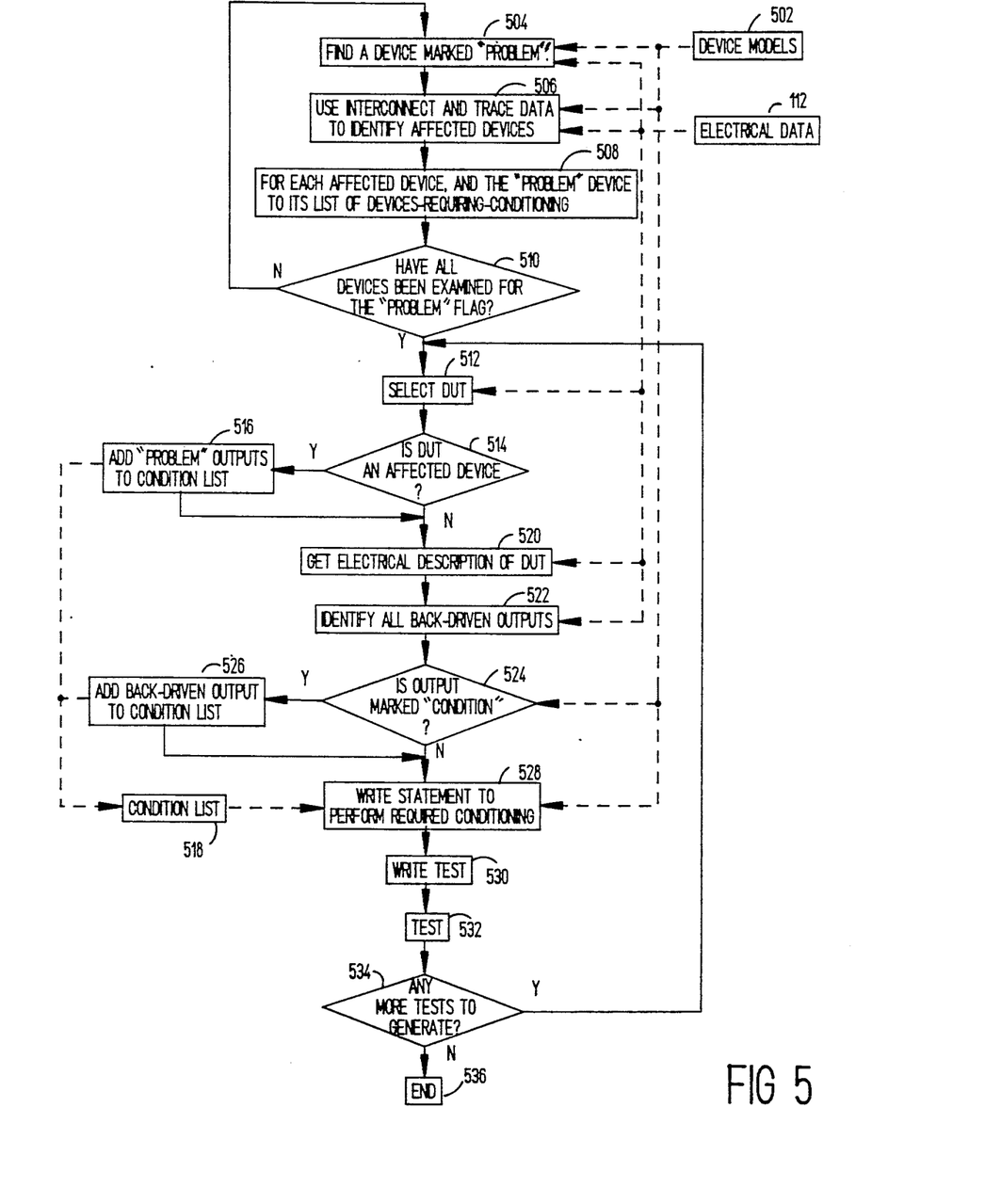
FIG. 5 is a detailed flow chart illustrating the preferred embodiment of the method of the present invention.

Device models library 502 contains a plurality of pre-generated generic models for commonly used digital integrated circuit chips (IC's). Essentially, each model is a test routine which is to be inserted directly into the board test specification. Each device model provides, for a specific device, pin-out information (i.e., which pins are inputs, outputs, bi-directional, or unused), trace data (i.e., information which relates each device output to the inputs which affect it), a test program, a method for how to condition the device, and device specific information including a test pattern rate and required signal levels. In addition, each device model may contain a PROBLEM flag and/or a CONDITION flag for each output.

The PROBLEM flag is used to indicate whether an output is a "problem" or interfering output (e.g., an oscillator) as described above. PROBLEM flag=TRUE indicates a problem output. The CONDITION flag is used to indicate whether an output should be conditioned prior to being back-driven. CONDITION flag=TRUE indicates an output which requires conditioning prior to being back-driven.

Figure 4:
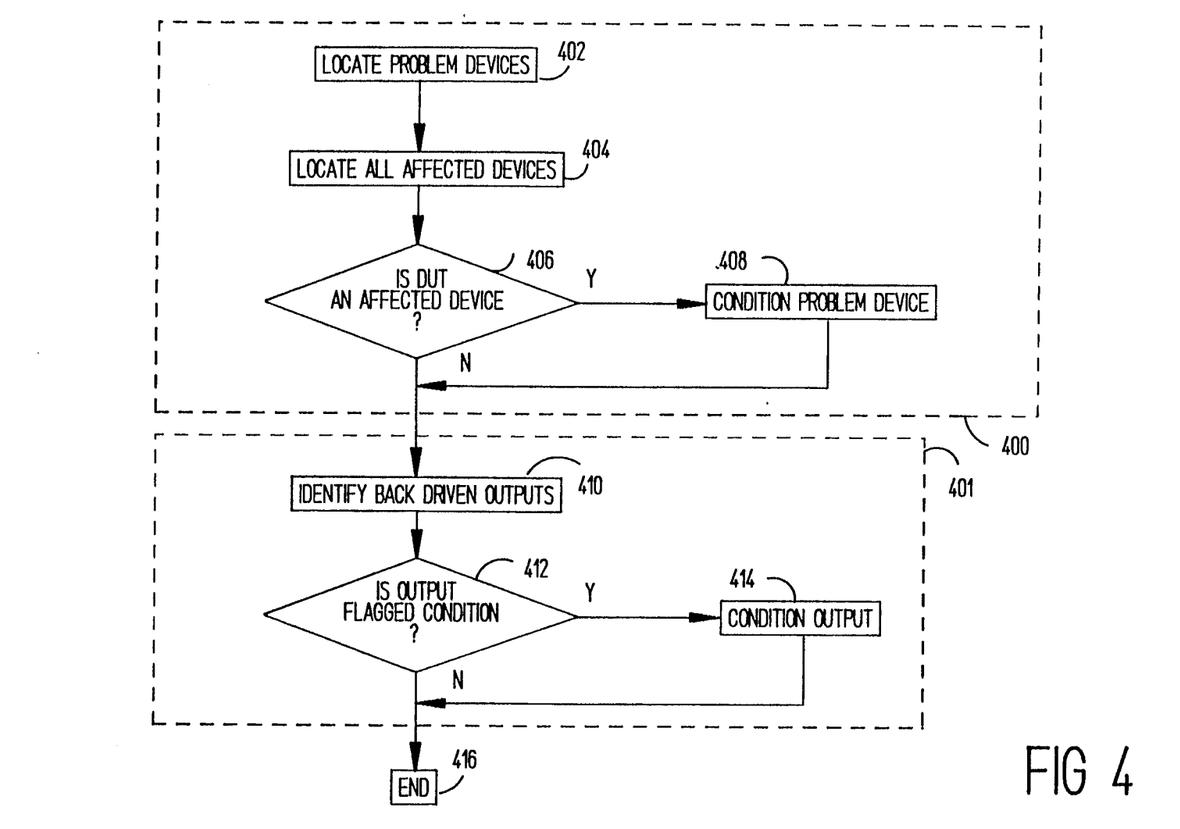
FIG. 4 is an elementary flow chart of the method of the present invention.

FIG. 4 shows an elementary flow chart of the method of the present invention. The flow chart is divided into two stages, which can be performed in any order. In a first stage 400, problem devices are located in the circuit and conditioned if necessary. In a second stage 401, back-driven outputs are located and conditioned if necessary.

First stage 400 comprises steps 402–408. At step 402, problem devices on the circuit board are located. Electrical interconnect information and trace data are then used at step 404 to locate each device on the board which may be adversely affected by a problem device during test. A DUT is then selected for test generation, and at step 406, the DUT is checked to see if it is affected by any problem devices. If the DUT is an affected device, then the outputs of the problem devices which affect the DUT are conditioned at step 408. That is, a test statement (instruction) will be added to the test for the DUT so that the problem device will be conditioned (e.g., disabled) prior to testing the DUT. This will prevent the problem device from interfering with testing of the DUT.

Second stage 401 comprises steps 410-414. At step 410, the electrical interconnect information is used to identify outputs which will be back-driven during testing of the DUT. At step 412, the device models library is checked for each back-driven output to determine whether the output should be conditioned prior to back-driving. Any outputs which are flagged for conditioning, are conditioned at step 414. That is, a first statement (instruction) will be added to the test for the DUT so that the outputs will be conditioned prior to testing the DUT. The method finishes at step 416.

A more detailed description of the preferred embodiment of the present invention is now described with reference to FIG. 5. At step 504, the board to be tested is checked for problem devices. Problem devices are indicated in device models library 502 by setting PROBLEM=TRUE. Thus, for each device listed in electrical database 112, the corresponding device model in device models library 502 is checked for the PROBLEM flag. If a device is a problem, then the electrical interconnect data from electrical database 112 and trace data from device models library 502 are used at step 506 to identify devices which may potentially be affected by the problem device.

The trace data in device models library 502 is information which relates each output of a device to the inputs which affect it. The trace data is used in conjunction with the electrical interconnect information to "trace" a signal from the problem output downstream as it propagates through the circuit. The conventional tester uses trace data (i.e., back-trace data) to trace back (upstream) from a DUT to devices which may affect it. The invention, on the other hand, uses the trace data to trace a signal forward (downstream) from a problem device to affected devices. Any device through which the signal from the problem output propagates is called an affected device.

A list of devices-requiring-conditioning is maintained for each device to be tested. At step 508, the problem device is added to the devices-requiring-conditioning list for each affected device. At step 510, it is determined whether all devices on the board have been examined for for the PROBLEM flag. If all devices have been examined, then the method continues at step 512. If not, then the method repeats steps 504-510.

At step 512, a device (DUT) is selected for test generation from electrical database 112. At step 514, the devices-requiring-conditioning list for the DUT is checked to determined if the DUT is an affected device. An empty devices-requiring-conditioning list means that the DUT is not an affected device. If the DUT is an affected device, then any problem outputs (i.e., affecting devices) are added to a condition list 518 at step 516.

At step 520, test generator 102 gets an electrical description of the DUT from electrical database 112 and a test method for the DUT from device models library 502. Then, at step 522, electrical interconnect data from electrical database 112 is used in conjunction with the electrical description and test method for the DUT to identify all device outputs which must be back-driven in order to test the DUT. At step 524, the device models library is checked to determine whether the CONDITION flag has been set for any of the back-driven outputs. If a back-driven output is flagged CONDITION, then at step 526, the output is added to condition list 518.

Condition list 518 is a list of output pins which require conditioning prior to testing the DUT. For each output listed in condition list 518, the test statements required to perform the conditioning are written at step 528. Writing the test statements to perform the conditioning involves: (a) retrieving from device models library 502 one or more conditioning methods for each device to be conditioned, (b) selecting the appropriate conditioning methods for each device such that a non-conflicting set of conditioning methods are produced, and (c) combining the conditioning methods into a single test statement.

Finally, at step 530, the in-circuit ATE test 532 is written for the DUT. Writing the test involves retrieving a generic test for the DUT from device models library 502 and then merging the conditioning test statement from step 528. At step 534, the method checks to determine whether more tests are to be generated. If test generation is desired for an additional device, then the method proceeds to step 512 where the next DUT is selected for test generation. If generation of an additional test is not desired at step 534, then the method terminates at step 536.

Note that in this method, only devices which require conditioning during testing of the DUT are conditioned. No unnecessary conditioning is performed. This simplifies testing and reduces the number of driver/receiver channels which are required. In addition, problem devices which may directly or indirectly affect testing of the DUT are easily identified and conditioned.

Referring back to sample circuit 300, shown in FIG. 3, gate G1 is the DUT and G2 and G8 require conditioning prior to being back-driving (i.e., CONDITION flag=TRUE). Conditioning these two devices according to the present invention will involve conditioning only two gates (G2 and G8) and back-driving only eight input nodes. As compared to the example set forth above for the conventional test method, the present invention results in a substantial savings in test resources.

While the invention has been particularly shown and described with reference to a preferred embodiment thereof, it will be understood by those skilled in the art that various changes in form and details may be made therein without departing from the spirit and scope of the invention.

We claim:

1. In an automated test equipment system for testing a circuit board containing a plurality of interconnected digital devices, a method for generating an in-circuit test for a device under test wherein interconnected digital devices which need conditioning may be selectively conditioned, said method comprising the following steps:

(1) indicating in a device models library which device outputs are not to be back-driven without conditioning;

(2) receiving electrical interconnect data for the interconnected digital devices on the circuit board;

(3) determining from said electrical interconnect data which interconnected digital devices have outputs which are driving an input of the device under test such that said outputs will be back-driven during testing of the device under test; and (4) determining from the device models library which back-driven outputs should be conditioned prior to testing the device under test.

2. The method of claim 1, further comprising the following steps:
   (5) indicating in said device models library which interconnected digital devices are problem devices;
   (6) receiving trace data for each interconnected digital device on the board;
   (7) for each problem device, determining from said electrical interconnect data and said trace data which interconnected digital devices are potentially affected by an output of a problem device; and
   (8) indicating for each affected device which of said problem device outputs are to be conditioned prior to testing said affected device.

3. The method of claim 2, further comprising the following steps:
   (9) retrieving from the device models library conditioning methods for said back-driven outputs and said problem device outputs which are to be conditioned prior to testing said device under test;
   (10) combining said conditioning methods to create a test statement to perform the required conditioning;
   (11) retrieving a test method for testing the device under test from the device models library; and
   (12) merging said test statement for conditioning with said test method for testing the device under test.

4. The method of claim 1, further comprising the following steps:
   (5) retrieving from the device models library conditioning methods for said back-driven outputs which are to be conditioned prior to testing said device under test;
   (6) combining said conditioning methods to create a test statement to perform the required conditioning;
   (7) retrieving a test method for testing the device under test from the device models library; and
   (8) merging said test statement for conditioning with said test method for testing the device under test.

5. In an automated test equipment system for testing a circuit board containing a plurality of interconnected digital devices, a method for generating an in-circuit test for a device under test wherein interconnected digital devices which need conditioning may be selectively conditioned, said method comprising the following steps:
   (1) indicating in a device models library which digital devices are problem devices;
   (2) receiving electrical interconnect data for the interconnected devices on the circuit board;
   (3) receiving trace data for each interconnected digital device on the board;
   (4) determining from said electrical interconnect data and said trace data which digital devices are potentially affected by an output of a problem device; and
   (5) indicating for each affected device which of said problem device outputs are to be disabled prior to testing said affected device.

6. The method of claim 5, further comprising the following steps:
   (6) retrieving from the device models library conditioning methods for said problem device outputs which are to be conditioned prior to testing said device under test;
   (7) combining said conditioning methods to create a test statement to perform the required conditioning;
   (8) retrieving a test method for testing the device under test from the device models library; and
   (9) merging said test statement for conditioning with said test method for testing the device under test.

7. A method for automatically generating an in-circuit board test for a circuit board comprising a plurality of interconnected devices, said method comprising the steps of:
   (1) indicating in a device models library which digital devices are problem devices;
   (2) indicating in said device models library which digital device outputs are not to be back-driven without conditioning;
   (3) receiving electrical interconnect data for the interconnected devices on the circuit board;
   (4) receiving trace data for each interconnected digital device on the board;
   (5) determining from said electrical interconnect data and said trace data which digital devices are potentially affected by an output of a problem device;
   (6) indicating for each affected device which of said problem device outputs are to be conditioned prior to testing said affected device;
   (7) selecting a digital device under test;
   (8) determining from said electrical interconnect data which interconnected digital devices have outputs which are driving an input of the device under test such that said outputs will be back-driven during testing of the device under test; and
   (9) determining from the device models library which back-driven outputs should be conditioned prior to testing the device under test.

8. The method of claim 7, further comprising the following steps:
   (10) retrieving from the device models library conditioning methods for said back-driven outputs and for said problem device outputs which are to be conditioned prior to testing said device under test;
   (11) combining said conditioning methods to create a test statement to perform the required conditioning;
   (12) retrieving a test method for testing the device under test from the device models library; and
   (13) merging said test statement for conditioning with said test method for testing the device under test.

* * * * *